United States Patent [19]
Ishida

[11] Patent Number: 6,100,171
[45] Date of Patent: Aug. 8, 2000

[54] REDUCTION OF BORON PENETRATION BY LASER ANNEAL REMOVAL OF FLUORINE

[75] Inventor: Emi Ishida, Sunnyvale, Calif.

[73] Assignee: Advanced Micro Devices, Inc., Sunnyvale, Calif.

[21] Appl. No.: 09/033,784

[22] Filed: Mar. 3, 1998

[51] Int. Cl.$^7$ .................................................. H01L 21/42
[52] U.S. Cl. ...................... 438/535; 438/510; 438/142; 438/478
[58] Field of Search .................................... 438/535, 510

[56] References Cited

U.S. PATENT DOCUMENTS

| | | | |
|---|---|---|---|
| 4,748,131 | 5/1988 | Zietlow | 437/24 |
| 4,764,478 | 8/1988 | Hiruta | 437/29 |
| 5,364,803 | 11/1994 | Lur et al. | 437/40 |
| 5,393,676 | 2/1995 | Anjum et al. | 437/24 |
| 5,395,780 | 3/1995 | Hwang | 437/44 |
| 5,633,177 | 5/1997 | Anjum | 438/301 |
| 5,681,759 | 10/1997 | Zhang | 437/21 |
| 5,719,065 | 2/1998 | Takemura et al. | 437/21 |
| 5,821,175 | 10/1998 | Engelsberg | 438/795 |
| 5,851,862 | 12/1998 | Ohtani et al. | 438/166 |

OTHER PUBLICATIONS

J. C. Hsieh et al. "Characteristics of Mos Capacitors of BF2 or B Implanted Polysilicon Gate with and without POCl3 Co–doped" IEEE Electron Device Letters, vol. 14 No. 5 May 1993.

K. Imen et al. "Laser–assisted Micron scale Particle Removal", Appl. Phys. Lett. vol. 58 No. 2 Jan. 14, 1991.

J.M. Sung et al., "Fluorine Effect of Boron Diffusion of P+ Gate Devices", International Electron Devices Meeting Technical Digest from the International Electron Devices Meeting in Washington, D.C., Dec. 3–6, 1989, pp. 447–450.

*Primary Examiner*—Matthew Smith
*Assistant Examiner*—Granvill Lee
*Attorney, Agent, or Firm*—Renner, Otto, Boisselle & Sklar, LLP

[57] ABSTRACT

In one embodiment, the present invention relates to a method of removing fluorine from a gate conductor involving the steps of providing a semiconductor device containing a substrate, a gate insulator layer overlying a portion of the substrate, a gate conductor containing fluorine overlying the gate insulator layer, and a source and a drain region adjacent the gate insulator layer; and laser annealing the semiconductor device at an energy level sufficient to melt at least a portion of the gate conductor thereby inducing the removal of fluorine from the gate conductor. In another embodiment, the present invention relates to a method of making a transistor involving the steps of forming a gate conductor overlying a gate insulator layer, wherein the gate conductor and the gate insulator layer overlie a portion of a substrate, doping the substrate and gate conductor with $BF_2^+$ to form in the substrate a source region and a drain region adjacent the gate insulator layer and a channel region between the source and drain regions and under the gate insulator layer; laser annealing the doped gate conductor, the doped source region and the doped drain region at an energy level sufficient to melt at least a portion of the doped gate conductor, thereby removing fluorine from the melted portion of the gate conductor; and subsequently performing an RTA to activate the doped source region and the doped drain region

20 Claims, 2 Drawing Sheets

REDUCTION OF BORON PENETRATION BY LASER ANNEAL REMOVAL OF FLUORINE

TECHNICAL FIELD

The present invention generally relates to reducing boron penetration. In particular, the present invention relates to a method of removing fluorine from a doped gate conductor of a semiconductor device thereby reducing boron penetration into the underlying gate oxide and/or channel region.

BACKGROUND ART

Field-effect transistors (FETs) and other related insulated-gate electronic devices are mainstay components of metal oxide semiconductor (MOS) integrated circuits. A MOSFET generally consists of two closely spaced, doped regions in a substrate; namely, the source region and the drain region. The region between the two is the channel region above which a thin insulation layer such as a gate oxide layer is formed. A gate conductor is formed from a gate material directly over the insulation layer directly above the channel and a voltage applied to the gate conductor affects the electronic properties of the channel region, whereby the MOSFET can control current flow between the source region and the drain region (e.g., is turned on and off).

PMOS devices are formed by implanting the substrate with a p-type dopant to form heavily doped p+ source and drain regions using a self-aligned process. Since the gate conductor is used in the self-aligned process, it is also implanted with a p-type dopant. Preferred examples of p-type dopant ions include $B^+$ and $BF_2^+$. Among $B^+$ and $BF_2^+$, $BF_2^+$ is preferred because of its larger atomic mass. The larger atomic mass results in a lesser implant depth as well as greater damage to the material in which it is implanted. This damage results in less channeling, and therefore shallower implanted profiles. However, there are significant problems associated with using $BF_2^+$ as a p-type dopant.

In particular, when fluorine is present in a gate conductor along with boron, fluorine enhances boron penetration through the gate oxide and into the channel region during thermal anneals. Boron which has penetrated into the silicon substrate may cause a shift in the threshold voltage ($V_{th}$) of the operating device. This is because boron diffusion into the channel region results in a change in the concentration level of the n-channel substrate thereby causing a shift in threshold voltage and degrading oxide quality.

Accordingly, an efficient and practical solution to the problems associating with using $BF_2^+$ as a p-type dopant is desired.

SUMMARY OF THE INVENTION

By performing a laser annealing process to melt at least a portion of the doped gate material, most of the fluorine, which is implanted along with boron when using $BF_2^+$ as a p-type species, is removed from the doped gate material thus reducing boron penetration into the gate insulator and/or channel region.

In one embodiment, the present invention relates to a method of removing fluorine from a gate conductor involving the steps of providing a semiconductor device containing a substrate, a gate insulator layer overlying a portion of the substrate, a gate conductor containing fluorine overlying the gate insulator layer, and a source and a drain region adjacent the gate insulator layer; and laser annealing the semiconductor device at an energy level sufficient to melt at least a portion of the gate conductor thereby inducing removal of fluorine from the gate conductor.

In another embodiment, the present invention relates to a method of making a transistor involving the steps of forming a gate conductor overlying a gate insulator layer, wherein the gate conductor and the gate insulator layer overlie a portion of a substrate, doping the substrate and gate conductor with $BF_2^+$ to form in the substrate a source region and a drain region adjacent the gate insulator layer and a channel region between the source and drain regions and under the gate insulator layer; laser annealing the doped gate conductor, the doped source region and the doped drain region at an energy level sufficient to melt at least a portion of the doped gate conductor, thereby removing fluorine from the melted portion of the gate conductor; and subsequently performing an RTA to activate the doped source region and the doped drain region.

In yet another embodiment, the present invention relates to a method of reducing dopant diffusion from a doped gate conductor to an underlying gate insulator or channel region involving the steps of providing a semiconductor device containing a substrate, a gate insulator layer overlying a portion of the substrate, a doped gate conductor overlying the gate insulator layer, a source and a drain region adjacent the gate insulator layer, and a channel region below the gate insulator layer and between the source and drain region; and laser annealing the semiconductor device using an excimer laser with an energy fluence of about 0.5 to about 0.9 J/cm$^2$ to melt at least a portion of the doped gate conductor thereby reducing dopant diffusion from the doped gate conductor to the underlying gate insulator or channel region.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention includes a semiconductor processing method which involves the use of a laser to melt, for a short period of time, gate material. In a specific embodiment, an excimer laser is used to melt a $BF_2^+$ doped polysilicon gate material of a PMOSFET. The laser annealing process is used to anneal polysilicon gate material to remove fluorine from the gate material thereby inhibiting boron diffusion into the gate insulator and into the channel region. The laser process operates with nanosecond pulses at an energy level sufficient to melt at least a portion of the gate material (and preferably without melting material in the source/drain regions). The laser annealing process enhances the removal of fluorine from the gate material without detrimentally impacting the source/drain regions, the channel region, or other regions of the semiconductor device. After using the laser, a rapid thermal anneal (RTA) process is performed. The RTA activates the source/drain regions and promotes the diffusion of boron throughout the polysilicon gate material.

The details of common steps for making semiconductor devices including MOSFETs are discussed in detail in numerous disclosures such as, for example, VLSI Technology, by S.M. Sze, $2^{nd}$ Edition (McGraw-Hill Publishing Co.). Consequently, the performance of these common steps is discussed herein only briefly.

Figure 1:
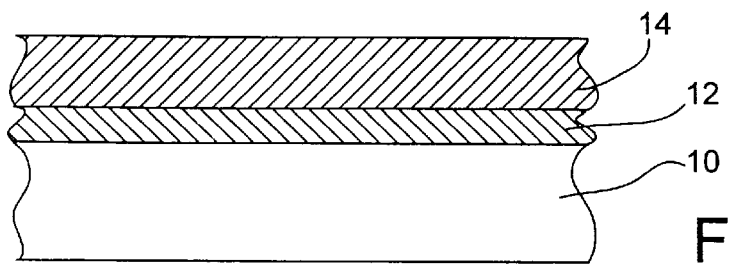
FIG. 1 is a cross-section diagram illustrating a semiconductor substrate with an insulating material and an undoped polysilicon material in accordance with the present invention.

The present invention will now be described with reference to the drawings, wherein like reference numerals are used to refer to like elements throughout. Referring to FIG. 1, a semiconductor substrate 10 suitable for producing a PMOS device according to the present invention is initially provided. Suitable substrates include commercially available silicon wafers. Substrate 10 is preferably a silicon crystalline material. Substrate 10 is implanted (or doped) with impurities in order to achieve an n- starting material generally necessary for receiving opposite doped p-type source and drain diffusions. An insulating material 12 is formed across a surface of substrate 10. The insulating material 12 is typically an oxide and is relatively thin in order to subsequently constitute a gate insulator layer or a thin gate oxide layer. In a preferred embodiment, the insulating material 12 is silicon dioxide. The insulating material 12 is grown according to conventional thermal oxidation procedures, for example, where less than about 100 Å of oxide can be grown on the exposed surface of a silicon substrate. However, the thickness of the insulating material is not critical to this invention and can be often in the range of about 10 to about 200 Å.

A layer of gate material 14, such as undoped polysilicon, is deposited over the insulating material using any conventional methodology, such as low pressure chemical vapor deposition (LPCVD), atmospheric pressure CVD, plasma enhanced CVD, or other thin film deposition techniques. In one embodiment, the polysilicon material 14 has a thickness of less than about 4,000 Å, and preferably has a thickness of about 2,500 Å.

Figure 2:
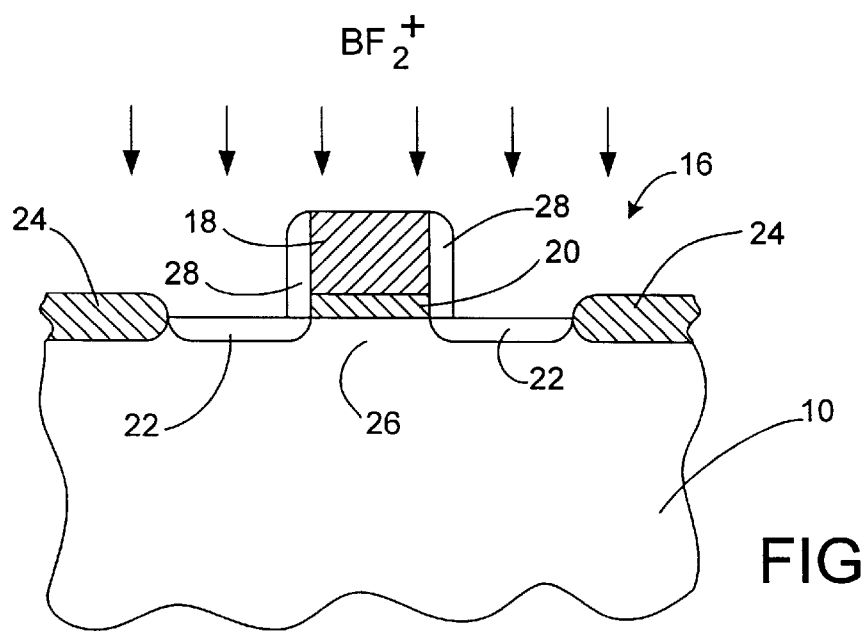
FIG. 2 is a cross-section diagram illustrating a PMOSFET device with a gate conductor overlying a gate insulator and between source and drain regions configured to receive $BF_2$ ions in accordance with the present invention.

One or more PMOSFET devices may be placed within and onto select areas of substrate 10. For example, FIG. 2 represents one embodiment of a MOSFET 16 is produced according to standard photolithography procedures. In particular, selected regions of gate material 14 and insulating material 12 are removed using positive or negative photoresists, masking and etching techniques to produce respectively a patterned gate conductor 18 directly over a gate insulator 20. A dry, anisotropic etching process is preferred. Optionally, spacers 28 can be employed. Sidewall spacers 28 can be formed via, for example, chemical vapor deposition followed by a directional etching such as, for example, reactive ion etching (RIE).

Using a known self-aligned process, $BF_2^+$ dopant ions are implanted within the substrate 10 as shown in FIG. 2 to form source and drain regions 22 and channel region 26. Shallow junctions are desirable for submicron device geometries and may be accomplished via several means, such as through low energy ion implantation, tilted ion beam implantation, use of implanted silicides or polysilicon, or by projection-gas immersion laser doping (P-GILD). In one embodiment, $BF_2^+$ is implanted at a concentration from about $5 \times 10^{13}$ ions/$cm^2$ to about $5 \times 10^{15}$ ions/$cm^2$ and an implantation energy from about 1 keV to about 50 keV.

Figure 3A:
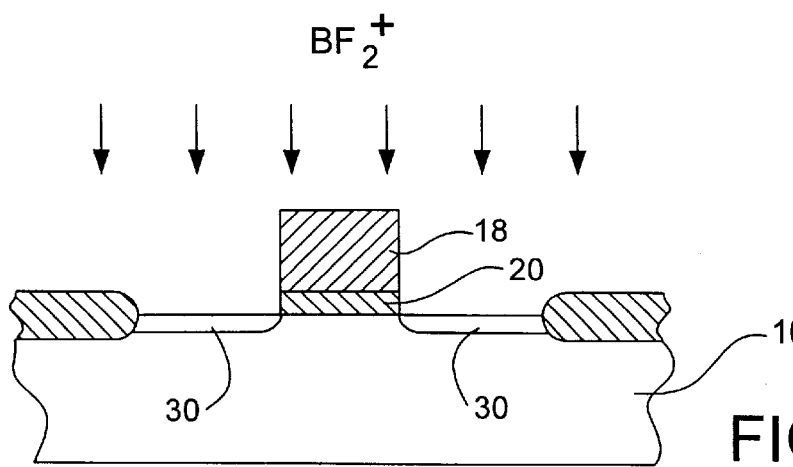
FIGS. 3A to 3C are cross-section diagrams illustrating a PMOSFET device with source/drain extensions in accordance with the present invention.
Figure 3B:
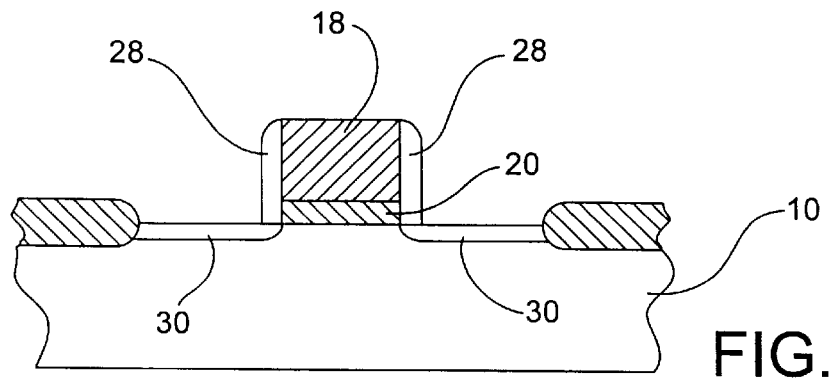
Figure 3C:
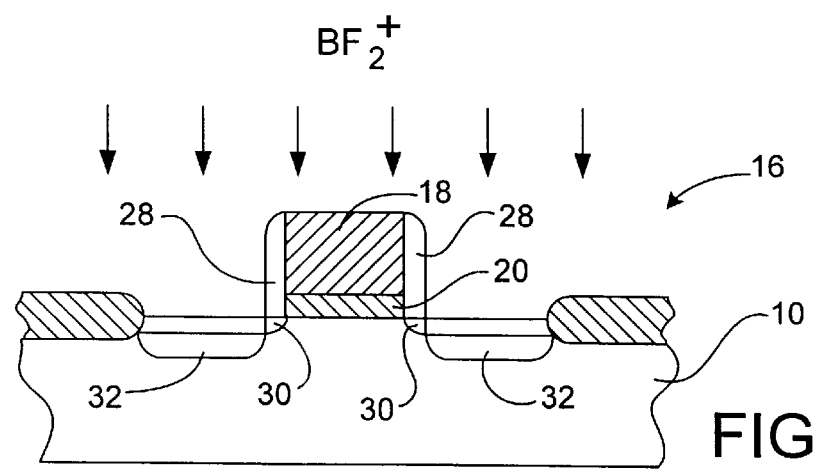

FIGS. 3A to 3C represent another embodiment of a MOSFET 16 produced according to standard photolithography procedures. In particular, a MOSFET device with source/drain extensions is made by first removing selected regions of the gate material 14 and the insulating material 12 using positive or negative photoresists, masking and etching techniques to produce respectively a patterned gate conductor 18 directly over a gate insulator 20, followed by implanting $BF_2^+$ dopant ions are implanted within the substrate 10 as shown in FIG. 3A to form lightly doped source and drain structures (LDD) or source and drain extensions 30 using a known self-aligned process. Shallow junctions may be accomplished via several means, such as through low energy ion implantation. In one embodiment, $BF_2^+$ is implanted at a concentration from about $5 \times 10^{13}$ ions/$cm^2$ to about $5 \times 10^{15}$ ions/$cm^2$ and an implantation energy from about 1 keV to about 50 keV. Referring to FIG. 3B, sidewall spacers 28 are formed via, for example, chemical vapor deposition followed by a directional etching such as, for example, reactive ion etching (RIE).

Using a known self-aligned process again, $BF_2^+$ dopant ions are implanted within the substrate 10 as shown in FIG. 3C to form deep source and drain regions or contact junctions 32. In one embodiment, $BF_2^+$ is implanted at a concentration from about $5 \times 10^{13}$ ions/$cm^2$ to about $5 \times 10^{15}$ ions/$cm^2$ and an implantation energy from about 1 keV to about 50 keV.

Figure 4:
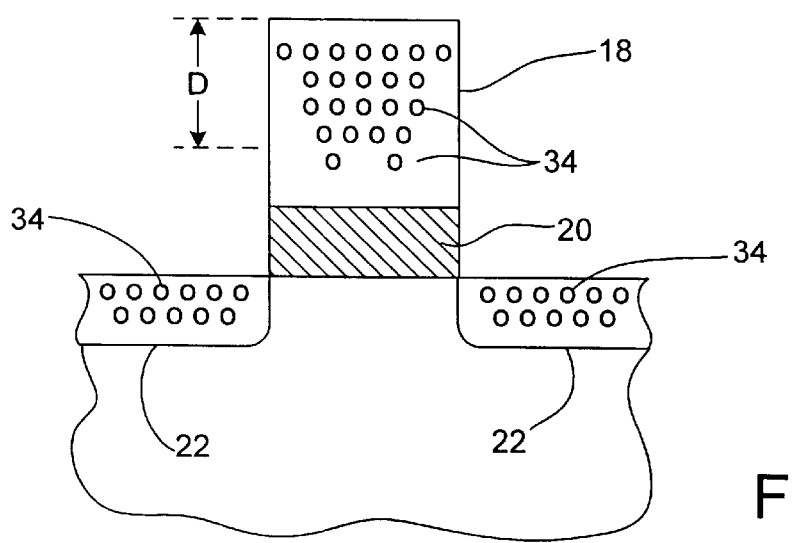
FIG. 4 is a cross-section diagram illustrating the PMOSFET device of FIG. 2 showing implanted impurities in the gate conductor and source and drain regions in accordance with the present invention.

As a consequence of such $BF_2^+$ implantation steps represented in FIGS. 2, 3A and 3C, however, $BF_2^+$ ions are also implanted into the gate conductor 18. Referring to FIG. 4, which is an exploded view of the MOSFET 16 shown in FIG. 2 without the spacers 28 (and which is analogously related to the MOSFET shown in FIG. 3C), the $BF_2^+$ ion implant dispersion is illustrated. A majority of the $BF_2^+$ dopant 34 is implanted at a relatively shallow depth of the gate conductor 18 and source and drain regions 22. Within the gate conductor 18, a substantial portion of the implanted $BF_2^+$ dopant 34 is within depth D. In one embodiment, the distance D is equivalent to the thickness of the gate conductor 18 (thickness being the distance from the gate insulator-gate conductor interface to the upper surface of the gate conductor). In another embodiment, the distance D is equivalent to about two-thirds of the thickness of the gate conductor 18. In yet another embodiment, the distance D is equivalent to about one-half of the thickness of the gate conductor 18. In still yet another embodiment, the distance D is equivalent to about one-third of the thickness of the gate conductor 18.

In one embodiment, the gate conductor 18 has about 70% of the dopant ions within depth D, and preferably about 80% of the dopant ions within depth D, and more preferably about 90% of the dopant ions within depth D. The amount of fluorine present in the gate conductor 18 within depth D is the initial fluorine concentration. The fluorine is derived from $BF_2^+$ ions, typically $BF_2^+$ ion degradation. In one embodiment, the gate conductor 18 has about 70% of the fluorine within depth D, and preferably about 80% of the fluorine within depth D, and more preferably about 90% of the fluorine within depth D.

Subsequent the formation of the doped gate conductor 18 and the doped source/drain regions 22, an anneal step using a laser annealing process is performed. Although other processing steps may be performed before the laser anneal process, the present invention relates to performing the laser anneal process after $BF_2^+$ ion implantation of the gate conductor 18. In a preferred embodiment, an excimer laser is used to remove fluorine. For example, an excimer laser such as a XeCl laser (wavelength of about 308 nm) is utilized to perform the anneal step.

When using the laser, it is necessary that the energy is high enough to melt at least a portion of the gate conductor 18. Although it is not required, it is preferable that the energy is low enough not to melt the source/drain regions 22. Accordingly, precise parameters depend upon the nature and identity of the gate conductor 18. For instance, melting polysilicon gate material containing a relatively high dopant concentration may require a lower energy than melting polysilicon gate material containing a relatively low dopant concentration. In one embodiment, the laser may be operated in a pulsed mode with an energy fluence range from about 0.5 to about 0.9 $J/cm^2$, and preferably from about 0.6 to about 0.8 $J/cm^2$ to melt at least a portion of the gate material. In a preferred embodiment, only a portion of the gate conductor 18 is melted.

The total duration of the laser anneal controlled by the number of pulses and the temporal profile of the laser may extend as long as needed (for a time sufficient) to remove of all or substantially all fluorine in the gate conductor through the melt depth. In one embodiment, greater than about 70% of the fluorine initially present in the portion of the doped gate conductor 18 which is melted is removed by laser annealing. In a preferred embodiment, greater than about 80% of the fluorine initially present in the portion of the doped gate conductor 18 which is melted is removed by laser annealing. In a most preferred embodiment, greater than about 90% of the fluorine initially present in the portion of the doped gate conductor 18 which is melted is removed by laser annealing.

It is necessary to melt only a portion of the gate conductor 18. The portion that is melted preferably contains a relatively high concentration of fluorine. Referring again to FIG. 4, the portion containing a relatively high concentration of fluorine is generally within depth D. In a preferred embodiment, the melt depth is approximately equal to depth D. Accordingly, it is not necessary to melt the entire gate conductor 18 (down to the gate insulator 20), although the entire gate conductor 18 may be melted.

The laser annealing process melts the gate conductor 18 (typically doped polysilicon), which induces the removal of fluorine from the gate conductor, and specifically from the portion of the gate conductor 18 which is melted. While not intending to be bound by any theory, it is believed that since the gate insulator 20 and/or lower portions of the gate conductor 18 (for example below depth D) are not melted, fluorine is outgassed upwardly through the melted portion of the gate conductor 18 rather than diffusing downward toward or through the gate insulator 20. Boron diffusion through the gate conductor 18 during the laser annealing process is substantially limited to the melt depth of the gate conductor 18.

After the laser anneal process is performed, a high temperature anneal is performed using an RTA process. However, it is not necessary to perform RTA immediately after the laser anneal process as other steps may be performed after the laser anneal and before the RTA. RTA is performed to activate the unactivated source and drain regions 22, and remaining unmelted boron in the gate conductor 18 (if any), thereby forming shallow junction source and drain regions. The RTA is performed at a temperature range from about 750 to about 1050° C. for about 15 to about 60 seconds to activate the source/drain regions.

Standard fabrication techniques can next be used to deposit standard remaining layers necessary to finalize the particular integrated circuit device, such as further insulation, metallization, and passivation layers. In particular, standard fabrication techniques can be used to deposit source, drain and gate contacts, metal and insulating layers. The resulting structure has a gate region which is entirely or substantially free of fluorine and thus not characterized by enhanced boron penetration into the channel region.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of removing fluorine from a gate conductor, comprising:

providing a semiconductor device comprising a substrate, a gate insulator layer overlying a portion of the substrate, a gate conductor comprising fluorine overlying the gate insulator layer, and a source and a drain region adjacent the gate insulator layer; and laser annealing the semiconductor device at an energy level sufficient to melt only a portion of the gate conductor thereby inducing removal of fluorine from the gate conductor.

2. The method of claim 1, wherein the gate conductor comprising fluorine is $BF_2^+$ doped polysilicon.

3. The method of claim 1, wherein laser annealing comprises irradiating with an excimer laser in a pulsed mode.

4. The method of claim 1, wherein laser annealing comprises irradiating with an excimer laser with an energy fluence of about 0.5 to about 0.9 $J/cm^2$.

5. The method of claim 1, wherein laser annealing comprises irradiating with an excimer laser with an energy fluence of about 0.6 to about 0.8 $J/cm^2$.

6. The method of claim 1, wherein the portion of the gate conductor melted is equivalent to a depth of about one-half of the thickness of the gate conductor.

7. The method of claim 1, wherein laser annealing is performed at an energy level sufficient to melt at least a portion of the gate conductor but insufficient to melt the source and drain regions.

8. The method of claim 1, wherein the gate conductor comprises less fluorine after laser annealing than the gate conductor comprises before laser annealing.

9. A method of making a transistor, comprising:

forming a gate conductor overlying a gate insulator layer, wherein the gate conductor and the gate insulator layer overlie a portion of a substrate, doping the substrate and gate conductor with $BF_2^+$ to form in the substrate a source region and a drain region adjacent the gate insulator layer and a channel region between the source and drain regions and under the gate insulator layer;

laser annealing the doped gate conductor, the doped source region and the doped drain region at an energy level sufficient to melt only a portion of the doped gate conductor, thereby removing fluorine from the melted portion of the gate conductor; and subsequently performing an RTA to activate the doped source region and the doped drain region.

10. The method of claim 9, wherein doping the gate conductor, the source region and the drain region comprises subjecting the gate conductor and substrate to ion implantation.

11. The method of claim 10, wherein ion implantation comprises the step of implanting $BF_2^+$ at a concentration from about $5 \times 10^{13}$ ions/cm$^2$ to about $5 \times 10^{15}$ ions/cm$^2$ and an implantation energy from about 1 keV to about 50 keV.

12. The method of claim 9, wherein laser annealing comprises irradiating with an excimer laser with an energy fluence of about 0.5 to about 0.9 J/cm$^2$.

13. The method of claim 9, wherein laser annealing is performed with an excimer laser in a pulsed mode.

14. The method of claim 9, wherein laser annealing is performed with an XeCl excimer laser.

15. The method of claim 9, wherein the portion of the doped gate conductor melted is equivalent to a depth of about one-half of the thickness of the doped gate conductor.

16. A method of reducing dopant diffusion from a doped gate conductor to an underlying gate insulator or channel region, comprising:

providing a semiconductor device comprising a substrate, a gate insulator layer overlying a portion of the substrate, a doped gate conductor overlying the gate insulator layer, a source and a drain region adjacent the gate insulator layer, and a channel region below the gate insulator layer and between the source and drain region; and laser annealing the semiconductor device using an excimer laser with an energy fluence of about 0.5 to about 0.9 J/cm$^2$ to melt only a portion of the doped gate conductor thereby reducing dopant diffusion from the doped gate conductor to the underlying gate insulator or channel region.

17. The method of claim 16, wherein laser annealing comprises irradiating with an excimer laser with an energy fluence of about 0.6 to about 0.8 J/cm$^2$.

18. The method of claim 16, wherein the doped gate conductor provided comprises $BF_2^+$ doped polysilicon.

19. The method of claim 16, wherein laser annealing is performed at an energy level sufficient to melt at least a portion of the doped gate conductor but insufficient to melt the source and drain regions.

20. The method of claim 16, wherein the semiconductor device has a lightly doped drain type structure.

* * * * *